(12) United States Patent
Mills

(10) Patent No.: US 6,919,833 B2
(45) Date of Patent: Jul. 19, 2005

(54) PARALLEL CONVERTER TOPOLOGY FOR REDUCING NON-LINEARITY ERRORS

(76) Inventor: Regan N. Mills, 1 Tamarock Terr., Stoneham, MA (US) 02180

( * ) Notice: Subject to any disclaimer, the term of this patent is extended or adjusted under 35 U.S.C. 154(b) by 0 days.

(21) Appl. No.: 10/655,377

(22) Filed: Sep. 4, 2003

(65) Prior Publication Data

US 2005/0052301 A1 Mar. 10, 2005

(51) Int. Cl.⁷ .............................. H03M 1/06; H03M 1/66
(52) U.S. Cl. ......................................... 341/144; 341/118
(58) Field of Search ................................ 341/144, 118, 341/120, 145, 154, 121; 324/74, 307; 455/115.1; 345/98

(56) References Cited

U.S. PATENT DOCUMENTS

| | | | | |
|---|---|---|---|---|
| 4,272,760 A | * | 6/1981 | Prazak et al. ................ | 341/120 |
| 4,829,236 A | * | 5/1989 | Brenardi et al. .............. | 324/74 |
| 5,043,731 A | * | 8/1991 | Nishimura .................. | 341/154 |
| 5,248,970 A | * | 9/1993 | Sooch et al. ................ | 341/120 |
| 5,731,772 A | * | 3/1998 | Mikkola et al. ............. | 341/118 |
| 6,154,158 A | * | 11/2000 | Walker ........................ | 341/118 |
| 6,191,715 B1 | * | 2/2001 | Fowers ........................ | 341/120 |
| 6,204,783 B1 | * | 3/2001 | Paz et al. .................... | 341/118 |
| 6,304,201 B1 | * | 10/2001 | Moreland et al. ........... | 341/154 |
| 6,307,490 B1 | * | 10/2001 | Litfin et al. ................. | 341/121 |
| 6,603,418 B2 | * | 8/2003 | Al-Awadhi .................. | 341/144 |
| 6,624,772 B1 | * | 9/2003 | Gealow et al. .............. | 341/120 |
| 6,670,938 B1 | * | 12/2003 | Yoshida ....................... | 345/98 |
| 6,703,956 B1 | * | 3/2004 | Mueller et al. .............. | 341/145 |
| 6,763,227 B2 | * | 7/2004 | Kramer ....................... | 455/115.1 |
| 6,794,920 B1 | * | 9/2004 | Aliahmad et al. ........... | 327/307 |
| 6,819,273 B2 | * | 11/2004 | Mizutani et al. ............ | 341/118 |

OTHER PUBLICATIONS

Fujitsu Product Flyer: "MB86060 16–Bit Interpolating Digital to Analog Converter," Version 1.2, Jun. 2000.

* cited by examiner

*Primary Examiner*—Patrick Wamsley

(57) ABSTRACT

A parallel DAC topology reduces systematic linearity errors by offsetting the digital codes inputted to the individual DACs from one another. Linearity errors that would normally add together are thus reduced.

19 Claims, 2 Drawing Sheets

(Without Offsets)

(With Offsets)

PARALLEL CONVERTER TOPOLOGY FOR REDUCING NON-LINEARITY ERRORS

CROSS-REFERENCES TO RELATED APPLICATIONS

Not Applicable.

STATEMENT REGARDING FEDERALLY SPONSORED RESEARCH OR DEVELOPMENT

Not Applicable.

REFERENCE TO MICROFICHE APPENDIX

Not Applicable

BACKGROUND OF THE INVENTION

1. Field of the Invention

This invention relates generally to circuits and processes for converting digital codes to analog signals, and, more particularly, to parallel digital-to-analog converter topologies.

2. Description of Related Art

Improvements to data conversion products, such as digital-to-analog converters (DACs), generally involve steps for increasing precision and/or speed. As is known, one way of increasing precision without sacrificing speed is to operate multiple DACs in parallel.

FIG. 1 shows a topology 100 of parallel DACs according to the prior art. A plurality of DACs 110, 112, 114, 116 is connected in parallel. Each DAC receives the same input code (Code In) and generates an output signal in response to the input code. A combining circuit 118 combines the output signals from the DACs to produce an overall output signal, $V_{OUT}$.

As is known, each of the DACs in the topology 100 is susceptible to noise. The level of this noise limits the precision of the individual DACs. Because noise is generally random, averaging the outputs of the DACs reduces its overall effect. In the parallel configuration 100, adding the outputs of the individual DACs averages out the noise without adversely affecting speed. For N DACs connected in parallel, noise is known to be reduced by approximately one over the square root of N.

Although the topology of FIG. 1 effectively reduces noise, we have recognized that it does not generally reduce linearity errors. As is known, linearity errors are erroneous deviations in a DAC's output signal as input code is varied. Ideally, the output of a DAC versus input code should be a perfect stair-step function that accurately mirrors the discrete steps of the digital input code. Imperfections within the DAC, however, may cause certain "steps" to be too long or too short, giving rise to an error known as differential non-linearity (DNL). In addition, the overall path of the stair-step function can deviate from the ideal path, giving rise to an error known as integral non-linearity (INL). We have recognized that, far from being random, these DNL and INL errors tend to be repeatable among different DACs of the same type. Because they are repeatable, averaging does not generally reduce their effects.

What is needed, therefore, is a DAC topology that reduces linearity errors as well as noise.

BRIEF SUMMARY OF THE INVENTION

With the foregoing background in mind, it is an object of the invention to reduce linearity errors in DAC topologies.

To achieve the foregoing object, as well as other objectives and advantages, a circuit for converting a digital input signal to an analog output signal includes a plurality of digital-to-analog converters (DACs). The inputs of the DACs are each made to receive an input code related to the digital input signal, and the outputs of the DACs are combined together to produce an overall output signal. The input code for at least one of the plurality of DACs is offset from the others by a number of bits. Consequently, all of the DACs do not convert the same code at the same time, and linearity errors that occur at particular codes are made not to coincide. The effect of linearity error on the overall output signal is thereby diminished.

BRIEF DESCRIPTION OF THE DRAWINGS

Additional objects, advantages, and novel features of the invention will become apparent from a consideration of the ensuing description and drawings, in which.

DETAILED DESCRIPTION OF THE PREFERRED EMBODIMENT

Figure 1:
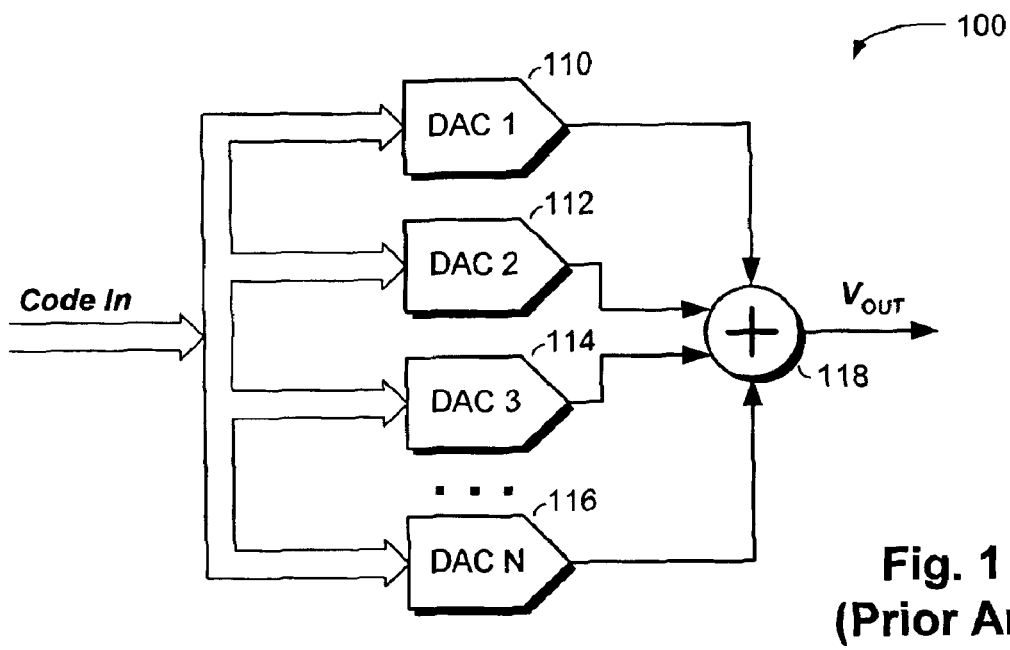
FIG. 1 is a simplified schematic of a parallel DAC topology according to the prior art.
Figure 2:
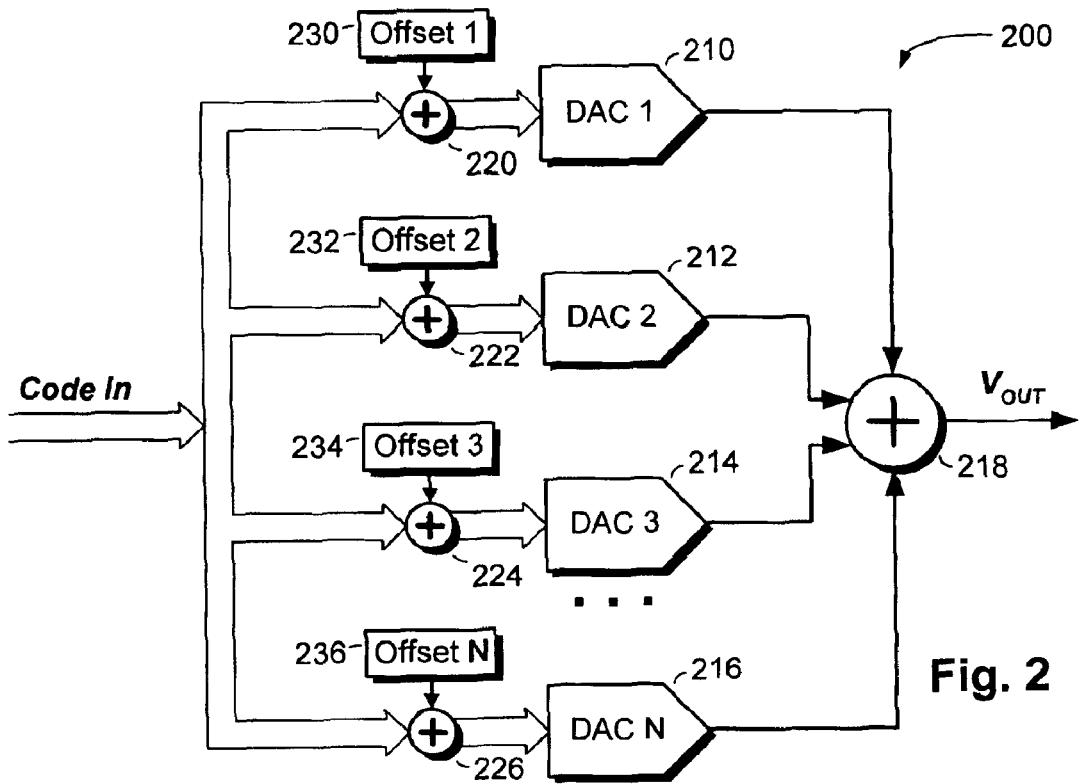
FIG. 2 is a simplified schematic of a parallel DAC topology according to an embodiment of the invention.

FIG. 2 shows an illustrative embodiment of the invention. A circuit topology 200 includes DACs 210, 212, 214, and 216, which are similar to DACs 110, 112, 114, and 116 of FIG. 1. The outputs of the DACs are combined by a combining circuit 218, which is similar to the combining circuit 118 of FIG. 1.

In contrast with FIG. 1, the circuit of FIG. 2 includes a plurality of summers 220, 222, 224, and 226 and a plurality of offset codes 230, 232, 234, and 236. Unlike FIG. 1, wherein all of the DACs 110, 112, 114, and 116 receive the same input code ("Code In"), the different DACs of FIG. 2 may receive different input codes. The input codes received by the DACs are versions of Code In that are offset from Code In by the respective offset codes. Preferably, each of the offset codes 230, 232, 234, and 236 is unique, meaning it is not the same as any of the other offset codes.

The use of different offset codes reduces the linearity errors of the topology 200 as compared with the prior topology 100. Linearity errors of a DAC tend to be code-dependent. For example, a DAC may exhibit an erroneously high output signal repeatedly at certain codes, such as 1024 bits, 2048 bits, or 4096 bits. By offsetting the codes provided to the different DACs by different amounts, the DACs do not all undergo the same code transitions for the same values of Code In. Linearity errors in the overall output signal are therefore reduced.

Figure 3:
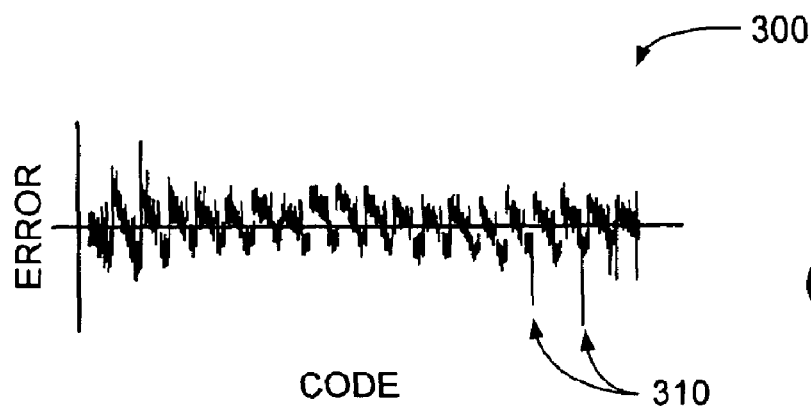
FIG. 3 is a graph showing the error of the parallel DAC topology of FIG. 2 as a function of DAC code, with all offset codes set to zero.
Figure 4:
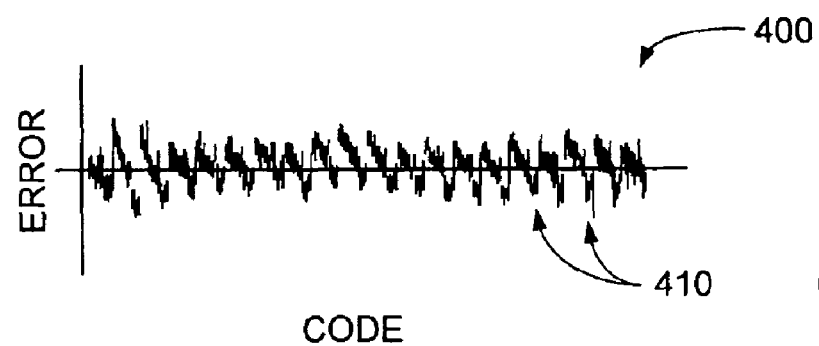
FIG. 4 is a graph showing the error of the parallel DAC topology of FIG. 2 as a function of DAC code, with offset codes for different ones of the DACs having different values.

FIGS. 3 and 4 show graphs of linearity error versus Code In for the circuit of FIG. 2. To produce the graph of FIG. 3, all the offset codes 230, 232, 234, and 236 are set to zero. These settings cause the circuit 200 to perform the same was as the prior art circuit 100 of FIG. 1. Certain spikes are evident in this FIG. 3. These spikes are found at codes 310 and correspond to large linearity errors of the individual DACs that constitute the circuit 200.

FIG. 4 is the same as FIG. 3, except that the offset codes 230, 232, 234, and 236 are all set to different values. Small offset codes are used (i.e., between 0 and 3 bits). It is apparent that the spikes at the input codes 310 are diminished. Because linearity spikes for the different converters are made to occur at different values of Code In, the overall effect of these spikes on the combined output signal is reduced. Consequently, the overall peak-to-peak linearity error of the topology 200 is diminished.

Adding offset codes to the input of each DAC may introduce an analog offset error at the output of the topology 200. This error may be eliminated by setting the sum of the offset codes to zero. Alternatively, one can adjust Code In to compensate for the analog offset error, without placing additional constraints on the choice of offset codes.

In the preferred embodiment, the different DACs 210, 212, 214, and 216 are of the same type. They are preferably fabricated together on the same integrated circuit, such as an Application Specific Integrated Circuit (ASIC). Values for the offset codes 230, 232, 234, and 236 are preferably determined after characterizing the DACs. The offset codes are preferably stored in non-volatile memory, where are located within the same integrated circuit that houses the DACs. The summers 220, 222, 224, and 226 are preferably also housed within the same integrated circuit. Housing all of these elements together allows the DAC topology to be programmed very simply as a unit by providing a single value of Code In.

Figure 5:
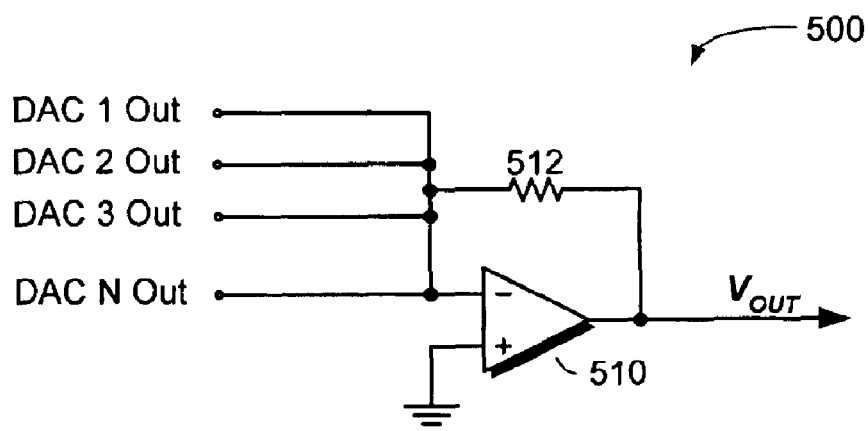
FIG. 5 is a simplified schematic of a current-to-voltage converter suitable for use as a combining circuit in the circuit of FIG. 2.

The DACs 210, 212, 214, and 216 preferably supply their output signals in the form of currents, and the combining circuit is preferably a current-to-voltage converter. FIG. 5 shows an example of a current-to-voltage converter 500 that is suitable for implementing the combining circuit 218 of FIG. 2. Outputs from the DACs 210, 212, 214, and 216 are connected together at an inverting input of an operational amplifier 510. A non-inverting input of the operational amplifier 510 is preferably grounded. A sum of the output currents from the individual DACs flows through a feedback resistor 512, to produce a voltage $V_{OUT}$. Negative feedback ensures that the voltage at the inverting input of the operational amplifier remains at virtual ground during operation, and that $V_{OUT}$ equals the negative of the sum of the output currents from the DACs times the resistance of the feedback resistor 512.

A preferred use of the circuit 200 of FIG. 2 is for producing test signals in an automatic test system. As is known, manufacturers of semiconductor devices commonly use automatic test systems to determine whether devices meet their requirements. Testing devices early in the manufacturing process allows devices that fail their tests to be discarded before additional manufacturing costs are incurred. In addition, sorting devices into different categories based on test results allows manufacturers to sell devices having different performance at different prices. By integrating the circuit 200 into an automatic test system, better testing accuracy can be achieved. Greater accuracy allows devices to be tested to tighter tolerances, and allows good devices can be more readily distinguished from devices that fail to meet requirements. Tests can be conducted by applying a signal from the circuit 200 to a lead of a device under test and monitoring, via other tester resources, the device's response to the applied signal. The device's response determines whether the device is within specifications our outside of specifications.

Alternatives

Having described one embodiment, numerous alternative embodiments or variations can be made. For example, four (4) DACs are shown in the circuit of FIG. 2; however, the number of DACs to be used is clearly arbitrary and can be varied considerably within the scope of the invention.

Although the DACs are preferably identical, this is not required. For example, the DACs can be of different types, can be made by manufacturers, and can have different resolution.

The specific technology used to implement the circuit of FIG. 2 is also not critical to the invention. Although providing all components within a single integrated circuit provides numerous advantages, the circuit can alternatively be implemented using separate DACs, registers, and summers, or using combinations of separate components and integrated components.

As described herein, summers 220, 222, 224, and 226 are preferably hardware circuits. However, the invention does not require a hardware implementation. For instance, a computer or other processor may employ software to add offset codes to Code In. The computer can then program the different DACs directly with the different computed sums.

The offset codes are preferably fixed, i.e., they are determined based upon characterization of the DACs and then firmly established. Alternatively, however, the offset codes can be variable, e.g., changeable under program control, so that different offset codes may be used for different applications.

Preferably, each DAC receives a unique offset code. However, the effect of reducing linearity error can be achieved even if some of the DACs do not receive different offset codes. Where offset codes of zero are used, certain DACs may be provided without summers. Their outputs may simply be combined with outputs of other DACs that do employ summers.

It should be understood that the term "summer" as used herein describes both addition and subtraction. Therefore, some offset codes may be negative.

Also, the combining circuit need not be the same as that shown in FIG. 5. Any circuit that combines the output signals of the individual DACs to yield a signal proportional to their sum may be used.

Small values of offset code (0 to 3) have been used to produce the linearity improvements shown in FIG. 4. The invention is not limited to small offset codes, however. Small offset codes primarily improve DNL (i.e., linearity "spikes") but do little to improve INL (more gradual changes). Inspection of FIGS. 3 and 4 reveal, however, that gradual changes in linearity error do occur, and that these changes have periodic components. Using larger offset codes can reduce some of these periodic components. For example, to reduce a component that repeats every 1024 codes, offset codes for some DACs may be set to 512 bits and codes for others may be set to 0. When the outputs of these DACs receiving these different codes are combined, the DACs' linearity errors add "out of phase" and partially cancel. Moreover, large and small values can be combined for individual offset codes. For example, an offset code of 513 (i.e., $1+2^9$) may be used to affect both DNL and INL.

Although it is generally preferable for the circuit 200 to add no net analog offset error, there are times when deliberately adding offset error can be an advantage. For instance, one can deliberately design the sum of the offset codesto be non-zero to specifically compensate for inherent offset errors in the circuit 200 or in other parts of a system that includes the circuit 200.

While the invention has been particularly shown and described with reference to the preferred embodiments thereof, it will be understood by those skilled in the art that various changes in form and detail may be made therein without departing from the spirit and scope of the invention.

What is claimed is:

1. A circuit having an input for receiving a digital input signal and an output for sending an analog output signal, the circuit comprising:

DACs, each DAC having an input and an output;

summers coupled to the input of the circuit to receive the digital input signal, each summer receiving an offset code to produce a digital code proportional to a sum of the digital input signal and the offset code the digital code from each summer coupled to a different DAC; and a combining circuit having inputs coupled to the output of a respective DAC and an output coupled to the output of the circuit.

2. The circuit of claim 1, wherein each of the summers is a digital adding circuit for adding the digital signal at the input of the circuit to a respective offset code.

3. The circuit of claim 2, wherein the offset codes are stored in memory locations.

4. The circuit of claim 3, wherein the DACs, the summers, and the memory locations are fabricated in an integrated circuit.

5. The circuit of claim 4, wherein the offset codes are programmable.

6. The circuit of claim 1, wherein the offset codes are each held constant for different values of the digital input signal.

7. The circuit of claim 1, wherein each offset code is different from each other offset code.

8. The circuit of claim 1, wherein each of the DACs receives a version of the digital input signal that is offset by a unique offset code.

9. The circuit of claim 1, wherein the DACs are fabricated on a single integrated circuit.

10. The circuit of claim 1, wherein a sum of offset codes for the different ones of the DACs equals zero.

11. The circuit of claim 1, wherein a sum of offset codes for the different ones of the DACs equals a value that corresponds to a desired offset error of the circuit.

12. The circuit of claim 1, wherein a sum of offset codes for the different ones of the DACs equals a value that compensates a known offset error of the circuit.

13. The circuit of claim 1, wherein the combining circuit comprises a current-to-voltage converter, and the outputs of all of the DACs are coupled together at an input of the current-to-voltage converter.

14. A method of converting a digital input signal to an analog output signal, comprising:

adding different offset codes to the digital input signal to produce different sums;

converting the different sums to analog signals; and combining the analog signals to produce an output signal proportional to a sum of the analog signals.

15. The method of claim 14, further comprising:

applying a correction to the digital input signal to compensate for offset errors to be introduced by the different offset codes.

16. The method of claim 14, further comprising:

measuring an offset error at the output signal; and adjusting the different offset codes to compensate for the measured offset error.

17. The method of claim 14, wherein the different offset codes are unique.

18. The method of claim 14, wherein the combining step comprises adding the analog signals to produce the output signal.

19. A The method of claim 14, further comprising:

applying the output signal to an integrated circuit for testing the integrated circuit; and determining, based on a response of the integrated circuit to the output signal, whether the integrated circuit is functioning properly.

* * * * *